United States Patent
Chen et al.

(10) Patent No.: US 12,394,670 B2
(45) Date of Patent: Aug. 19, 2025

(54) NUCLEATION-FREE GAP FILL ALD PROCESS

(71) Applicant: Applied Materials, Inc., Santa Clara, CA (US)

(72) Inventors: Yihong Chen, San Jose, CA (US); Kelvin Chan, San Ramon, CA (US); Xinliang Lu, Fremont, CA (US); Srinivas Gandikota, Santa Clara, CA (US); Yong Wu, Sunnyvale, CA (US); Susmit Singha Roy, Campbell, CA (US); Chia Cheng Chin, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/672,296

(22) Filed: Feb. 15, 2022

(65) Prior Publication Data

US 2022/0172989 A1    Jun. 2, 2022

Related U.S. Application Data

(63) Continuation of application No. 16/467,669, filed as application No. PCT/US2017/063611 on Nov. 29, 2017, now Pat. No. 11,289,374.

(Continued)

(51) Int. Cl.
    *H01L 21/76*      (2006.01)
    *C23C 16/02*      (2006.01)
    (Continued)

(52) U.S. Cl.
    CPC ........ *H01L 21/76877* (2013.01); *C23C 16/02* (2013.01); *C23C 16/45553* (2013.01);
    (Continued)

(58) Field of Classification Search
None
See application file for complete search history.

(56) References Cited

U.S. PATENT DOCUMENTS

| | | |
|---|---|---|
| 2002/0086110 A1 | 7/2002 | Vercammen et al. |
| 2002/0192951 A1 | 12/2002 | Morita et al. |

(Continued)

FOREIGN PATENT DOCUMENTS

| | | |
|---|---|---|
| JP | 2001110747 A | 4/2001 |
| JP | 2014019912 A | 2/2014 |

(Continued)

OTHER PUBLICATIONS

"PCT International Preliminary Report on Patentability in PCT/US2017/063611 dated Jun. 27, 2019, 9 pages".

(Continued)

*Primary Examiner* — Bradley Smith
(74) *Attorney, Agent, or Firm* — SERVILLA WHITNEY LLC

(57) ABSTRACT

Processing methods comprise forming a gap fill layer comprising tungsten or molybdenum by exposing a substrate surface having at least one feature thereon sequentially to a metal precursor and a reducing agent comprising hydrogen to form the gap fill layer in the feature, wherein there is not a nucleation layer between the substrate surface and the gap fill layer.

16 Claims, 4 Drawing Sheets

Related U.S. Application Data

(60) Provisional application No. 62/434,788, filed on Dec. 15, 2016.

(51) Int. Cl.
*C23C 16/455* (2006.01)
*C23C 16/458* (2006.01)
*H01L 21/285* (2006.01)
*H01L 21/687* (2006.01)
*H01L 21/768* (2006.01)
*H01L 23/532* (2006.01)

(52) U.S. Cl.
CPC .... *C23C 16/4584* (2013.01); *H01L 21/28568* (2013.01); *H01L 21/68764* (2013.01); *H01L 21/68771* (2013.01); *H01L 21/76843* (2013.01); *H01L 21/76861* (2013.01); *H01L 23/53266* (2013.01)

(56) References Cited

U.S. PATENT DOCUMENTS

| | | | | |
|---|---|---|---|---|
| 2007/0020923 | A1* | 1/2007 | Kraus | H01L 21/76846 257/E21.171 |
| 2013/0171822 | A1 | 7/2013 | Chandrashekar et al. | |
| 2014/0030889 | A1* | 1/2014 | Chen | C23C 16/18 257/E21.584 |
| 2015/0294906 | A1 | 10/2015 | Wu et al. | |
| 2015/0348840 | A1 | 12/2015 | Bamnolker et al. | |
| 2016/0099144 | A1 | 4/2016 | Saly | |
| 2016/0307748 | A1 | 10/2016 | Saly | |
| 2016/0351401 | A1* | 12/2016 | Ba | C23C 16/455 |
| 2018/0053660 | A1* | 2/2018 | Jandl | H01L 21/28568 |

FOREIGN PATENT DOCUMENTS

| | | |
|---|---|---|
| JP | 2015232177 A | 12/2015 |
| KR | 20120033640 A | 4/2012 |

OTHER PUBLICATIONS

"PCT International Search Report and Written Opinion in PCT/US2017/063611 dated Feb. 28, 2018, 13 pages".

Wang, Guilei, et al., "Application of Atomic Layer Deposition Tungsten (ALD W) as Gate Filling Metal for 22 nm and Beyond Nodes CMOS Technology", ECS Journal of Solid State Science and Technology,, 2014, p. 82-p. 85.

* cited by examiner

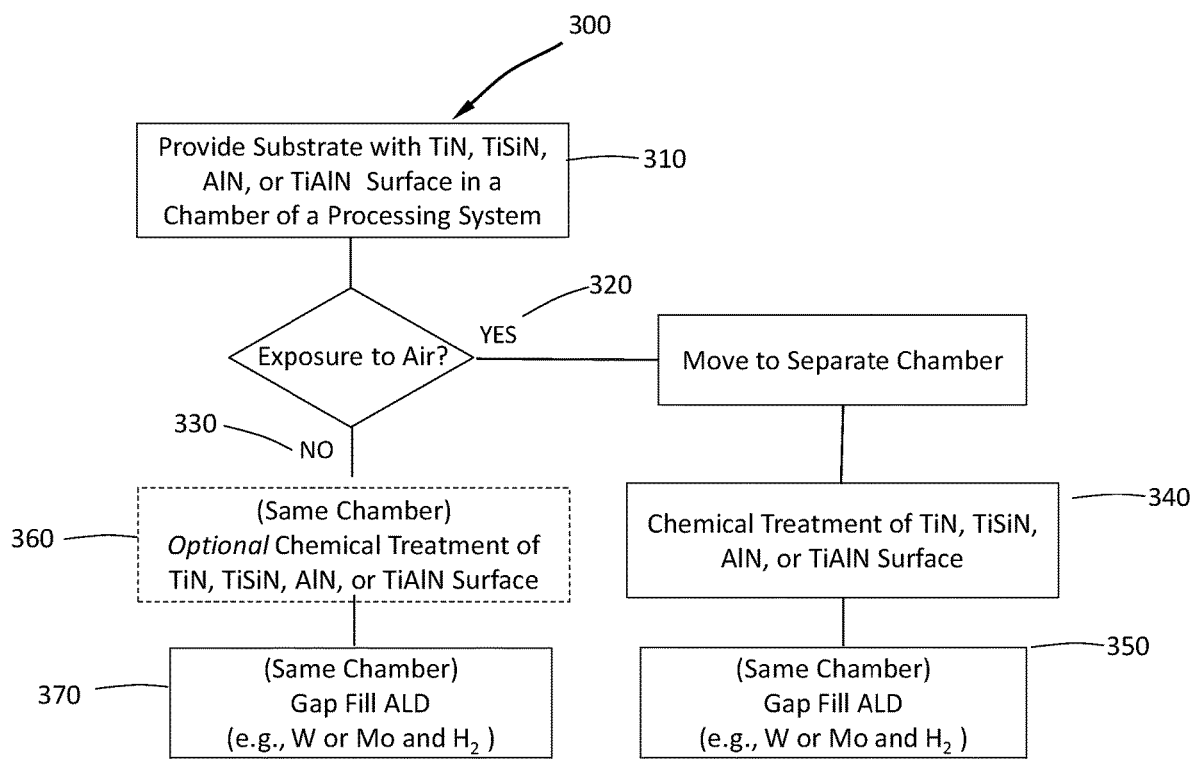
FIG. 6
Amended

NUCLEATION-FREE GAP FILL ALD PROCESS

CROSS-REFERENCE TO RELATED APPLICATIONS

This application is a continuation of U.S. patent application Ser. No. 16/467,669, filed Jun. 7, 2019, which is the National Stage entry of PCT/US17/63611, filed on Nov. 29, 2017, which claims priority to U.S. Provisional Ser. No. 62/434,788, filed on Dec. 15, 2016, all of which are incorporated herein by reference in their entireties.

TECHNICAL FIELD

The present disclosure relates generally to methods of depositing thin films. In particular, the disclosure relates to processes for the deposition of gap fill films comprising, e.g., tungsten or molybdenum.

BACKGROUND

Manufacturing of 3D-NAND devices and devices for applications such as logic and DRAM includes a process that can fill the word lines, vias, gaps, etc. with a metal. The presence of a metal in the word lines allows electrical connections to the control gates of NAND transistors. One challenge of such a metal fill is that, for example, the 3D-NAND structures are microns deep. Another challenge is that the metal also has to fill the lateral spaces between the stacks of insulator (commonly silicon oxide).

The deposition of gap fill thin films, e.g., tungsten- or molybdenum-containing thin films, in features with ultra-high aspect ratios is challenging. The 3D semiconductor devices require seamless fill into horizontal and reentrant trenches. Incomplete trench filling may lead to high resistance, contamination, loss of filled materials, and, therefore, degradation of device performance.

Conventionally, the atomic layer deposition (ALD) of tungsten-containing materials are based on the binary reaction $WF_6+3H_2 \rightarrow W+6HF$. Briefly, $WF_6$ and $H_2$ are exposed to substrate surface alternatingly (sequentially). It is believed that $WF_6$ partially decomposes on the substrate surface in a self-limiting reaction to form a fluorinated W surface with W—F exposed. An $H_2$ pulse reduces the fluorinated W—F surface to W. However, the reaction of $WF_6$ with the substrate (typically TiN) is very slow and exhibits significant incubation delay. This nucleation issue of $WF_6$ on the substrate surface results in random surface growth and poor deposition conformality. Deposition of an interlayer on TiN before $WF_6$—$H_2$ ALD cycles can serve as a nucleation promotor. ALD of molybdenum-containing materials presents analogous chemistries and challenges as the tungsten-containing materials.

Nucleation layers using metal silicides (WSix and MoSix) have been used as way a to overcome the incubation delay issue on various surfaces including (Si, $SiO_2$, TiN, etc.). The metal silicides were deposited by ALD using metal precursor and silanes ($SiH_4$, $Si_2H_6$, etc.) as co-reactant. However, silane-based metal silicide nucleation layer can exhibit high resistivity and high interfacial fluorine level.

There is a need in the art for methods of depositing a penetrating and conformal film to fill device components such as 3D-NAND word lines, vias and gaps for logic and DRAM and other applications. Additionally, there is a need in the art for methods of conformally and efficiently depositing gap fill films comprising, e.g., tungsten or molybdenum.

SUMMARY

One or more embodiments of the disclosure are directed to processing methods comprising forming a gap fill layer comprising tungsten or molybdenum by exposing a substrate surface having at least one feature thereon sequentially to a metal precursor and a reducing agent comprising hydrogen to form the gap fill layer in the feature. There is not a nucleation layer between the substrate surface and the gap fill layer.

Additional embodiments of the disclosure are directed to processing methods comprising positioning a substrate surface in a processing chamber. The substrate surface has at least one feature thereon. The substrate surface is sequentially exposed to a first metal precursor and a reactant to form an underlying layer, wherein the first metal precursor comprises one or more of a titanium precursor, an aluminum precursor, and a silicon precursor, and the reactant comprises a nitrogen precursor, an oxygen precursor, or combinations thereof. The underlying layer is sequentially exposed to a second metal precursor comprising a tungsten precursor or a molybdenum precursor, and a reducing agent comprising hydrogen ($H_2$) to form a gap fill layer on the underlying layer.

Further embodiments of the disclosure are directed to processing methods comprising placing a substrate having a substrate surface into a processing chamber comprising a plurality of sections. Each section is separated from adjacent sections by a gas curtain. The substrate surface has at least one feature with a top, bottom and sides and an aspect ratio of greater than or equal to 10:1. At least a portion of the substrate surface is exposed to a first process condition in a first section of the processing chamber. The first process condition comprises a precursor of titanium, aluminum, silicon, or combinations thereof. The substrate surface is laterally moved through a gas curtain to a second section of the processing chamber. The substrate surface is exposed to a second process condition in the second section of the processing chamber. The second process condition comprises a reactant to form a film with the precursor of titanium, aluminum, silicon or combinations thereof, the film comprising TiN, TiN, TiON, TiSiN, TiSiON, AlN, TiAlN, or TiAlON. Exposure to the first and second sections, including lateral movement of the substrate surface is optionally repeated to form an underlying layer. The substrate surface is laterally moved through a gas curtain to a third section of the processing chamber. The substrate surface is exposed to a third process condition in the third section of the processing chamber. The third process condition comprises a tungsten precursor or molybdenum precursor. The substrate surface is laterally moved through a gas curtain to a fourth section of the processing chamber. The substrate surface is exposed to a fourth process condition in the fourth section of the processing chamber. The fourth process condition comprises hydrogen as a reductant to form a film with the tungsten or molybdenum precursor. Exposure to the third and fourth sections, including lateral movement of the substrate surface is optionally repeated to fill the feature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6 is a process flow diagram of a gap fill process in accordance with one or more embodiments of the disclosure.

DETAILED DESCRIPTION

Figure 1:
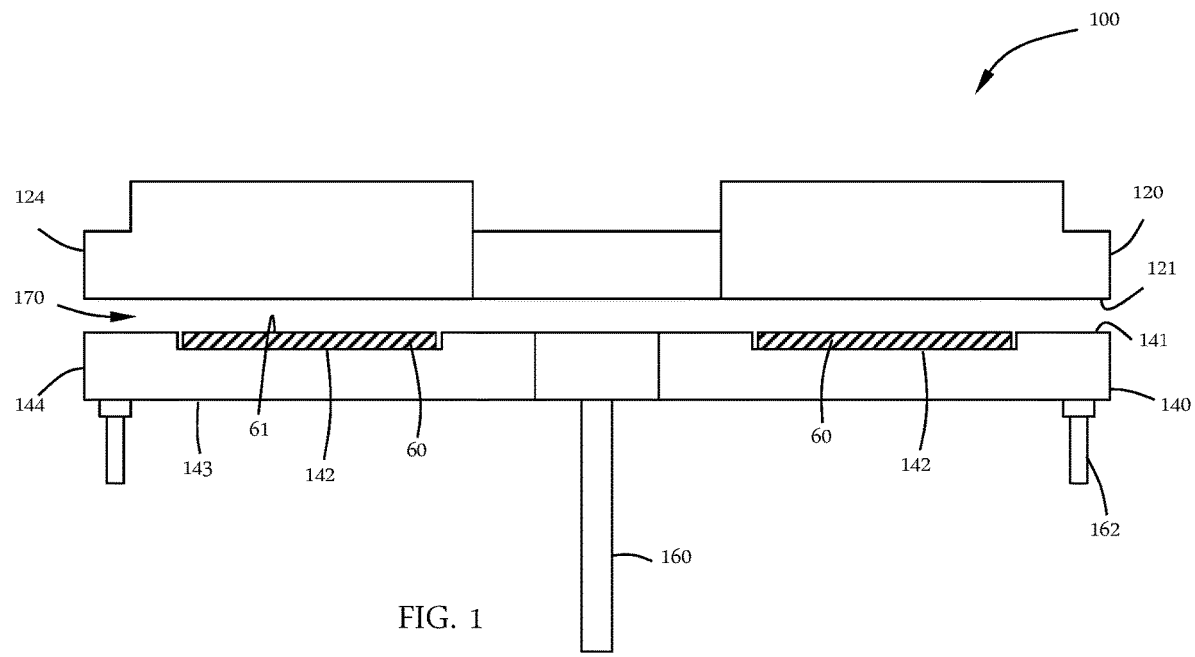
FIG. 1 shows a cross-sectional view of a batch processing chamber in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

Atomic Layer Deposition (ALD) is a process in which a substrate is sequentially exposed to a precursor and a reactant to deposit a film. ALD is a self-limiting process that allows for monolayer control of the deposition process. The immense amount of surface area of 3DNAND structures uses a high dose of precursor in each ALD cycle. An insufficient dose might lead to non-conformal deposition. A dose is typically expressed as partial pressure of precursor multiplied by exposure time (1 Langmuir or 1 L=1E-6 Torr-second). To obtain a certain dose, the substrate can be exposed for a long time at a low partial pressure or a short time at a high partial pressure. The product of time and pressure in both cases are equal. A high dose of precursor might be used for surface saturation on deep, entrenched structures that have a large surface area. While embodiments of the disclosure are presented with reference to 3DNAND structures, those skilled in the art will understand that the disclosure is not limited to 3DNAND devices. Embodiments of the disclosure can be used with other applications, for example, logic and DRAM.

High doses present a challenge to time-based ALD (also referred to as temporal ALD or time-domain ALD). For temporal ALD, process time and partial pressure are not independent of each other. Exposure time might be minimized to achieve high wafer throughput. To achieve a high dose in a short exposure, a high precursor partial pressure might be used. The interdependence between process time and partial pressure of temporal ALD is a result of the fact that there is a purge step between the two precursor exposures (or precursor and reactant) to ensure or minimize any gas phase mixing of the precursors.

Ramping of the partial pressure up from zero (zero during purge) to a certain high value during the exposure step takes time. Ramping of the partial pressure down from some high value to zero during the purge step also takes time. As a result, the total process time when a high dose of precursor is needed is generally not short. Using low pressures means faster ramp up/down of partial pressure, but use a longer exposure time for a high dose. Using high pressure means slower ramp up/down of partial pressure although a short exposure suffices to achieve a high dose.

Spatial ALD does not have the fundamental interdependence between process time and partial pressure. For spatial ALD, precursor cycles are spatially separated. Each spatially-separated zone (process region) can maintain pressure without any ramp up/down. A short exposure at high pressure for spatial ALD may be possible. The length of precursor exposure depends on how fast the substrate can be moved into and out of each spatially separated zone. Therefore, it is believed that spatial ALD can achieve much higher wafer throughput than temporal ALD when high dose precursor processes are used.

One or more embodiments of the disclosure deposit a gap fill layer, e.g., W ALD or Mo ALD process, without a nucleation layer. Some embodiments of the disclosure provide methods that advantageously fill features with aspect ratios of greater than 5:1, 10:1, 15:1, 20:1, 25:1, 30:1, 35:1 or 40:1 with a film. Advantageously, such W ALD or Mo ALD process can be integrated with TiN ALD.

TiN and other Ti-, Al-, and Si-containing films are commonly under W or Mo films on dielectric substrate. TiN is commonly used a glue layer for W films on dielectrice substrates. Applications include 3D-NAND wordline, DRAM buried wordline for 1x/y/z generation, source/drain contact and gate metal in CMOS for 10/7/5 nm technology node. Herein, detailed chemistries and processes will be presented with respect to W, but it is understood that the chemistries are analogous to Mo. Advantageously, hydrogen is used as the reductant rather than hydrogen-containing compounds such as $SiH_4$ or $B_2H_6$ to achieve low resistivity. Resistivity of films formed by $SiH_4$ or $B_2H_6$, for example, are much higher than $H_2$ reduced film.

Conventionally, the TiN layer and W layer were processed in different chambers, and the TiN layer was exposed to air while inline waiting for W ALD process. Due to the surface oxidation of TiN layer, incubation of the W ALD process was delayed and deteriorated; thus a nucleation layer was needed. One or more embodiments provide ways to reduce and/or eliminate surface oxidation of the so-called glue layer, which may include but is not limited to: TiN, TiN, TiON, TiSiN, TiSiON, AlN, TiAlN, or TiAlON.

Some embodiments of the disclosure are directed to film deposition processes using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

Figure 2:
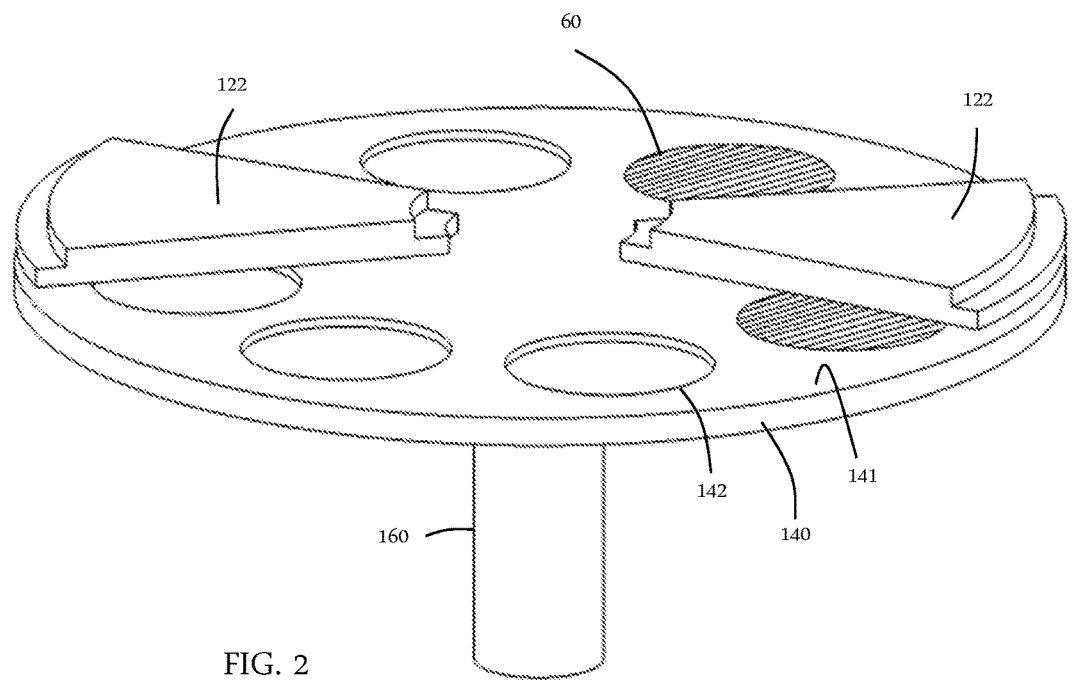
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
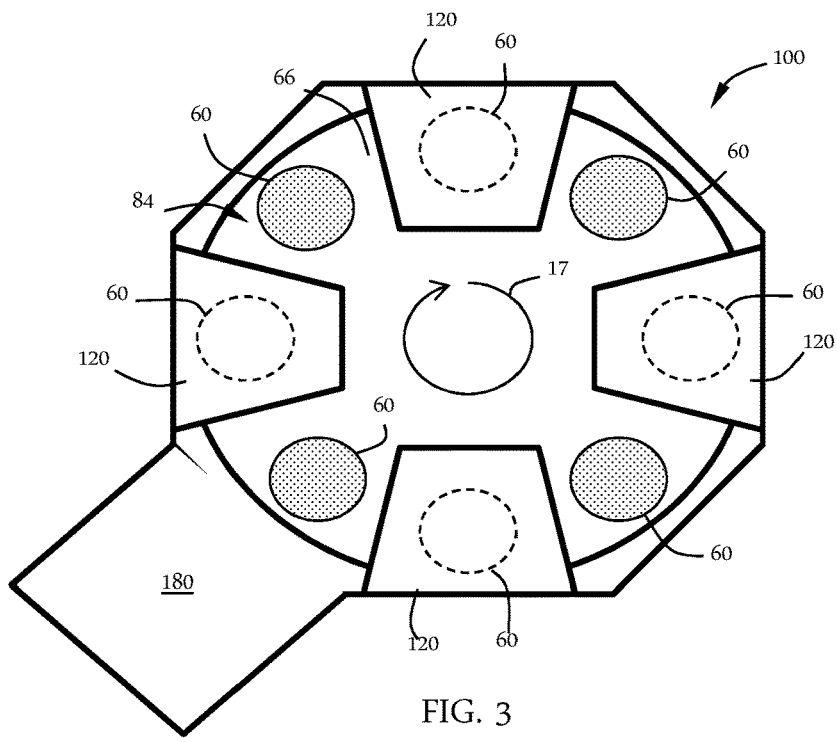
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

Figure 4:
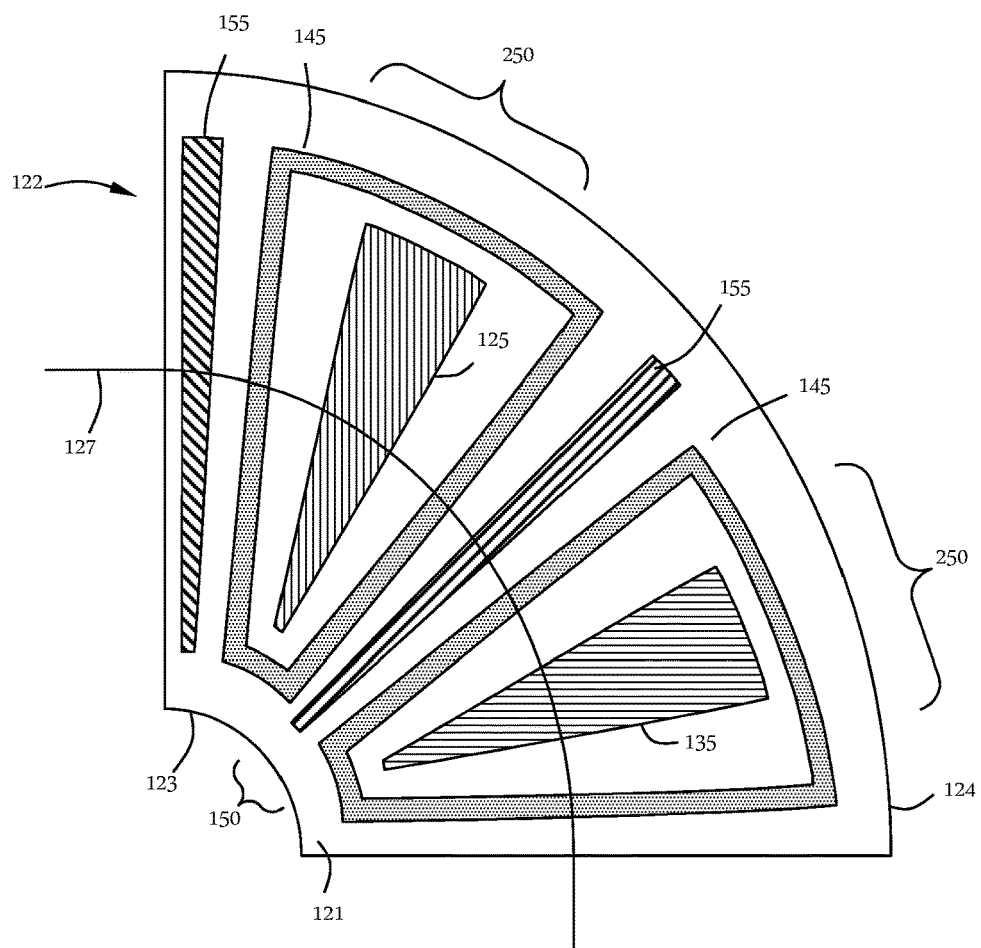
FIG. 4 shows a schematic view of a portion of a wedge shaped gas distribution assembly for use in a batch processing chamber in accordance with one or more embodiment of the disclosure.
Figure 5:
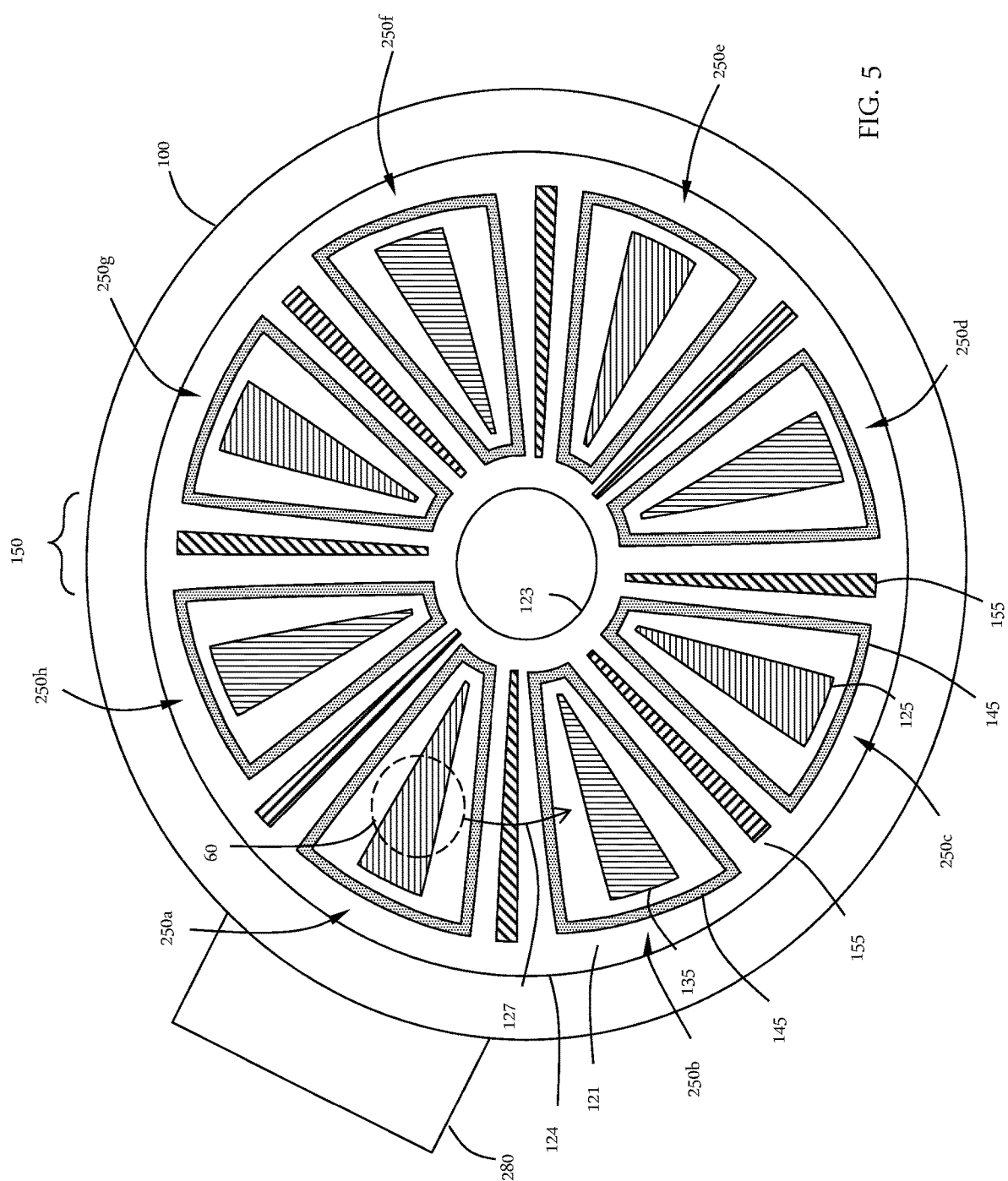
FIG. 5 shows a schematic view of a batch processing chamber in accordance with one or more embodiments of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and elongate vacuum ports 145 in a front surface 121 of the gas distribution assembly 220. The plurality of elongate gas ports 125, 135, 155 and elongate vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first gas port 125 and the second gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between.

Embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

FIG. 6 is a process flow diagram of a gap fill process 300 in accordance with one or more embodiments of the disclosure. A substrate with a Ti-, Al-, and Si-containing surface, e.g., TiN, by ALD is provided in a first chamber of a processing system at 310. In one or more embodiments, the first chamber may be where the TiN was formed.

In an ex situ embodiment, after TiN formation, the substrate may be exposed to air 320 during, for example, transfer to a second (separate) chamber. Due to the exposure to air, the surface may be exposed to a chemical treatment at 340 to remove oxides. In the same (second) chamber, the surface may then be exposed to gap fill ALD 350 to apply W or Mo using hydrogen as the reductant.

In an in situ embodiment, after TiN formation, the substrate is not exposed to air 330. This may occur when the substrate remains in the first chamber. For this embodiment, the surface may optionally be exposed to a chemical treatment at 360. In the same (first) chamber, the surface may then be exposed to gap fill ALD 370 to apply W or Mo using hydrogen as the reductant.

In some embodiments, the gap fill is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

The Ti-, Al-, and Si-containing (e.g., TiN) ALD process can be temporal or spatial. Typical wafer temperature is in the range of 50° C. to 700° C., in the range of about 200° C. to about 500° C., or in the range of about 250° C. to about 450° C. Process pressure may be in the range of 0.01 to 100 Torr. A co-reactant may comprise an oxygen source or a nitrogen source. The co-reactant may be selected from the group consisting of: $O_2$, $O_2$ plasma, NO, NO plasma, $N_2O$, $N_2O$ plasma, $H_2O$, $H_2O$ plasma, $D_2O$, $O_3$, $NH_3$, $NH_3$ plasma, $N_2$, $N_2$ plasma, $H_2$, $H_2$ plasma, and combinations thereof. Inert gases (for example He, Ar, and the like) may be present for dilution purposes.

Suitable titanium precursors include but are not limited to: $TiCl_4$, $TiI_4$, or $Ti[NMe_2]_4$; a co-reactant to form TiN may be $NH_3$. Suitable silicon precursors include, but are not limited to, poly-silanes ($Si_xH_y$) and organo-silanes. For example, poly-silanes include disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H_{10}$), hexasilane ($Si_6H_{14}$), cyclohexasilane ($Si_6H_{12}$) or, in general, $Si_xH_y$ with x=2 or more and y=2x or 2x+2, and combinations thereof. Other silicon precursors may be DCS ($SiH_2Cl_2$), HMDS ($Cl_3Si—SiCl_3$), TSA ($N(SiH_3)_3$). Suitable aluminum precursors include, but are not limited to, $AlR_3$, where R=is any ligand bonded to the Al by C, N, O, H, S, or halide. For example, an aluminum precursor may comprise one or more of the following: an alkyl-containing aluminum compound, an aluminum alkoxide-based compound, an aluminum amino-based compound, an aluminum halide, or combinations thereof. In an embodiment, the aluminum precursor is trimethylaluminum (TMA) ($AlMe_3$). In an embodiment, the aluminum precursor is aluminum trichloride ($AlCl_3$) or aluminum tribromide ($AlBr_3$).

The chemical treatment in the gap fill ALD chamber occurs at a wafer temperature in the range of 50° C. to 700° C., in the range of about 200° C. to about 500° C., or in the range of about 250° C. to about 450° C. Process pressure may be in the range of 0.01 to 100 Torr. Chemical treatment to remove oxides include exposure of the substrate to one or more of the following: $Si_xH_{2x+2}$, wherein x>=1; $Si_xH_yF_z$, wherein x>=2 and y+z=2x+2; $Si_xH_yCl_z$, wherein x>=2 and y+z=2x+2; $B_xH_y$, wherein x>=2 and y<=2x+2; $B_xH_yCl_z$, wherein x>=2 and y+z<=2x+2; $B_xH_yF_z$, wherein x>=2 and y+z<=2x+2; and $B_xH_yR_z$, wherein x>=2, y+z<=2x+2, and R comprises an alkyl group having 1 to 6 carbons.

Metal ALD Process. Tungsten or Molybdenum ALD process can be temporal or spatial. Typical wafer temperature is in the range of 50° C. to 700° C., in the range of about 200° C. to about 500° C., or in the range of about 250° C. to about 450° C. Process pressure may be in the range of 0.01 to 100 Torr. Precursors may be $WF_6$, $WCl_6$, $WCl_5$, $W(CO)_5$, $MoF_6$, $MoCl_6$, $MoCl_5$; co-reactant is $H_2$. Inert gases including Ar, He, $N_2$ can be added into chamber.

Accordingly, one or more embodiments of the disclosure are directed to processing methods utilizing a batch processing chamber like that shown in FIG. 5. A substrate 60 is placed into the processing chamber which has a plurality of sections 250, each section separated from adjacent section by a gas curtain 150. At least a portion of the substrate surface is exposed to a first process condition in a first section 250a of the processing chamber. The first process condition of some embodiments comprises an aluminum-containing precursor.

The substrate surface is laterally moved through a gas curtain 150 to a second section 250b of the processing chamber. The substrate surface is exposed to a second process condition in the second section 250b. The second process condition of some embodiments comprises a reactant to form a film with the aluminum-containing precursor represented by $AlC_xO_yN_z$, wherein x, y, and z are independently in the range of 0-1.

The substrate surface is laterally moved through a gas curtain 150 to a third section 250c of the processing chamber. The substrate surface can then be exposed to a third process condition in the third section 250c. The third process condition of some embodiments comprises a fluorinating agent that reacts with the $AlC_xO_yN_z$ film to form $AlF_3$.

The substrate surface is laterally moved through a gas curtain 150 to a fourth section 250d of the processing chamber. The substrate surface can then be exposed to a fourth process condition in the fourth section 250d. The fourth process condition of some embodiments comprises an etchant that reacts with the $AlF_3$ to make volatile species for removal.

In some embodiments, the substrate is exposed to additional first and second process conditions to form a film with a predetermined film thickness. In some embodiments, the substrate is exposed to additional third and fourth process conditions to repeated etch the substrate surface.

Optionally, the substrate surface is laterally moved through a gas curtain 150 to a fifth section 250e of the processing chamber. The substrate surface can then be exposed to a fifth process condition in the fifth section 250e. The fifth process condition of some embodiments comprises an oxidizing agent that reacts with Al—F bonds to make Al—O bonds.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge all of the excess reagent out of the chamber before flowing in additional regent. Therefore, any leftover reagent in the chamber may react. With spatial separation, excess reagent does not need to be purged, and cross-contamination is limited. Furthermore, a lot of time can be taken to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

The invention claimed is:

1. A processing method comprising:
exposing a substrate surface having at least one feature thereon to a first metal precursor comprising one or more of a titanium precursor, an aluminum precursor, and a silicon precursor, and a reactant comprising a nitrogen precursor to form an underlying layer comprising TiN, TiSiN, AlN, or TiAlN;
exposing the underlying layer to air to form surface oxidation;
applying a chemical treatment to the underlayer to remove the surface oxidation and form a treated surface; and
forming a gap fill layer on the treated surface using an atomic layer deposition (ALD) process by sequentially exposing the treated surface to a second metal precursor comprising tungsten or molybdenum and a reducing agent comprising hydrogen to form the gap fill layer in the feature, wherein there is not a nucleation layer between the treated surface and the gap fill layer.

2. The processing method of claim 1, wherein the second metal precursor is one or more of $WF_6$, $WCl_x$, $W(CO)_5$, $MoF_6$, $MoCl_x$, where x is 5 or 6, and the reducing agent is $H_2$.

3. The processing method of claim 1, wherein the treated surface is not exposed to air prior to forming the gap fill layer.

4. The processing method of claim 1, wherein the chemical treatment comprises exposing the substrate surface to one or more of the following:
$Si_xH_{2x+2}$, wherein $x>=1$;
$Si_xH_yF_z$, wherein $x>=2$ and $y+z=2x+2$;
$Si_xH_yCl_z$, wherein $x>=2$ and $y+z=2x+2$;
$B_xH_y$, wherein $x>=2$ and $y<=2x+2$;
$B_xH_yCl_z$, wherein $x>=2$ and $y+z<=2x+2$;
$B_xH_yF_z$, wherein $x>=2$ and $y+z<=2x+2$; and
$B_xH_yR_z$, wherein $x>=2$, $y+z<=2x+2$, and R comprises an alkyl group having 1 to 6 carbons.

5. The processing method of claim 1, wherein forming the gap fill layer comprises sequentially exposing the treated surface such that reactive gases of the second metal precursor and the reducing agent are separated from mixing.

6. The processing method of claim 1, wherein forming the gap fill layer comprises sequentially exposing the treated surface such that gas phase reactions between the second metal precursor and the reducing agent are reduced or prevented.

7. The processing method of claim 1, wherein the underlying layer is formed using an atomic layer deposition (ALD) process.

8. A processing method comprising:
sequentially exposing a substrate surface having at least one feature thereon to a first metal precursor and a reactant to form an underlying layer, wherein the first metal precursor comprises a titanium precursor and the reactant comprises a nitrogen precursor;
exposing the underlying layer to air to form surface oxides thereon;
applying a chemical treatment to the underlying layer to remove surface oxides and form a treated surface; and
exposing the treated surface sequentially to a second metal precursor comprising a tungsten precursor or a molybdenum precursor, and a reducing agent comprising hydrogen ($H_2$) to form a gap fill layer on the treated surface using an atomic layer deposition (ALD) process, wherein there is not a nucleation layer between the treated surface and the gap fill layer.

9. The processing method of claim 8, wherein the reducing agent consists essentially of hydrogen ($H_2$).

10. The processing method of claim 8, wherein the second metal precursor is one or more of $WF_6$, $WCl_x$, $W(CO)_5$, $MoF_6$, $MoCl_x$, where x is 5 or 6.

11. The processing method of claim 8, wherein the treated surface is not exposed to air before forming the gap fill layer.

12. The processing method of claim 8, wherein the chemical treatment comprises exposing the underlying layer to one or more of the following:
$Si_xH_{2x+2}$, wherein $x>=1$;
$Si_xH_yF_z$, wherein $x>=2$ and $y+z=2x+2$;
$Si_xH_yCl_z$, wherein $x>=2$ and $y+z=2x+2$;
$B_xH_y$, wherein $x>=2$ and $y<=2x+2$;
$B_xH_yCl_z$, wherein $x>=2$ and $y+z<=2x+2$;
$B_xH_yF_z$, wherein $x>=2$ and $y+z<=2x+2$; and
$B_xH_yR_z$, wherein $x>=2$, $y+z<=2x+2$, and R comprises an alkyl group having 1 to 6 carbons.

13. The processing method of claim 8, wherein the underlying layer comprises TiN.

14. The processing method of claim 8, wherein forming the gap fill layer comprises sequentially exposing the treated surface such that reactive gases of the second metal precursor and the reducing agent are separated from mixing.

15. The processing method of claim 8, wherein forming the gap fill layer comprises sequentially exposing the treated surface such that gas phase reactions between the second metal precursor and the reducing agent are reduced or prevented.

16. The processing method of claim 8, wherein the underlying layer is formed using an atomic layer deposition (ALD) process.

* * * * *